(12) United States Patent
Chang

(10) Patent No.: US 11,774,490 B1
(45) Date of Patent: Oct. 3, 2023

(54) REAL-TIME, IN-SITU RELIABILITY MONITORING IN AN INTEGRATED CIRCUIT

(71) Applicant: MARVELL ASIA PTE, LTD., Singapore (SG)

(72) Inventor: Runzi Chang, Saratoga, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 360 days.

(21) Appl. No.: 16/917,943

(22) Filed: Jul. 1, 2020

Related U.S. Application Data

(60) Provisional application No. 62/869,916, filed on Jul. 2, 2019.

(51) Int. Cl.
*G01R 31/26* (2020.01)
*G01R 31/28* (2006.01)
*G01R 31/52* (2020.01)
*H01L 29/772* (2006.01)

(52) U.S. Cl.
CPC ..... *G01R 31/2856* (2013.01); *G01R 31/2621* (2013.01); *G01R 31/2879* (2013.01); *G01R 31/52* (2020.01); *H01L 29/772* (2013.01)

(58) Field of Classification Search
CPC ........ G01R 31/52; G01R 31/00; G01R 31/26; G01R 31/2607; G01R 31/2621; G01R 31/28; G01R 31/2851; G01R 31/2855; G01R 31/2856; G01R 31/2872; G01R 31/2879; G01R 31/50; H01L 29/772; H01L 29/00; H01L 29/66; H01L 29/68; H01L 29/76

USPC .......... 324/500, 537, 750.3, 762.01, 762.02, 324/762.03, 762.09

See application file for complete search history.

(56) References Cited

U.S. PATENT DOCUMENTS

| | | | |
|---|---|---|---|
| 6,731,179 B2 | 5/2004 | Abadeer et al. | |
| 7,710,141 B2 | 5/2010 | La Rosa et al. | |
| 8,095,907 B2 | 1/2012 | Bickford et al. | |
| 8,847,604 B2 | 9/2014 | Baumann et al. | |
| 9,054,793 B2 | 6/2015 | Cook et al. | |
| 9,310,426 B2 | 4/2016 | Anemikos et al. | |
| 10,429,434 B2 | 10/2019 | Fifield et al. | |
| 2006/0267621 A1 | 11/2006 | Harris et al. | |
| 2006/0292845 A1 | 12/2006 | Chiang et al. | |
| 2009/0224795 A1 | 9/2009 | Nicollian et al. | |
| 2012/0051392 A1 | 3/2012 | Grillberger et al. | |
| 2013/0307663 A1* | 11/2013 | Roth ..................... | H01C 13/02 338/22 SD |

(Continued)

OTHER PUBLICATIONS

IBM, "On-Chip Test Structure," www.ip.com, IPCOM000169987D, pp. 1-5, May 5, 2008.

(Continued)

*Primary Examiner* — Hoai-An D. Nguyen

(57) ABSTRACT

An Integrated Circuit (IC) includes an electronic circuit and reliability monitoring circuitry. The electronic circuit includes multiple electronic components. The reliability monitoring circuitry is configured to assess, during operation of the IC in a host system, one or more parameters indicative of a reliability of one or more components-of-interest, selected from among the electronic components, and to provide an output indicative of the reliability.

13 Claims, 3 Drawing Sheets

(56) References Cited

U.S. PATENT DOCUMENTS

| | | | |
|---|---|---|---|
| 2014/0015542 A1* | 1/2014 | Bai | G01R 31/64 |
| | | | 324/548 |
| 2014/0095140 A1* | 4/2014 | Weir | G06F 30/20 |
| | | | 703/14 |
| 2014/0103937 A1 | 4/2014 | Khan et al. | |
| 2015/0061707 A1* | 3/2015 | Balasubramanian | |
| | | | G01R 31/31725 |
| | | | 324/750.01 |
| 2017/0074923 A1* | 3/2017 | Su | H01L 22/34 |
| 2019/0265293 A1* | 8/2019 | Fifield | G01R 31/2642 |
| 2020/0202965 A1* | 6/2020 | Merritt | H03L 7/0995 |
| 2021/0158731 A1* | 5/2021 | Hu | G09G 3/3233 |

OTHER PUBLICATIONS

IBM, "Timing Critical Path Based Digital Chip Aging Measurement," www.ip.com, IPCOM000183721D, pp. 1-6, Jun. 1, 2009.
IBM, "Circuit for On-Chip Measurement of Change of Threshold Voltage of Devices Due to Stress and Aging," www.ip.com, IPCOM000193032D, pp. 1-4, Feb. 8, 2010.
Webber, "Calculating Useful Lifetimes of Embedded Processors," Texas Instruments Application Report, pp. 1-9, Mar. 2020.
Kim, "Silicon Odometer: An On-Chip Reliability Monitor for Measuring Frequency Degradation of Digital Circuits," IEEE Journal of Solid State Circuits, vol. 43, No. 4, pp. 874-880, year 2008.

* cited by examiner

REAL-TIME, IN-SITU RELIABILITY MONITORING IN AN INTEGRATED CIRCUIT

CROSS-REFERENCE TO RELATED APPLICATIONS

This application claims the benefit of U.S. Provisional Patent Application 62/869,916, filed Jul. 2, 2019, whose disclosure is incorporated herein by reference.

FIELD OF THE DISCLOSURE

The present disclosure relates generally to Integrated Circuit (IC) design, and particularly to methods and systems for in-situ reliability monitoring in ICs.

BACKGROUND

Reliability of Integrated Circuits (ICs) is critical in many fields, for example in applications such as autonomous vehicles, artificial intelligence, cellular communication, and various others. Conventionally, reliability of ICs is established statistically, e.g., by qualifying the IC manufacturing process over selected samples.

The description above is presented as a general overview of related art in this field and should not be construed as an admission that any of the information it contains constitutes prior art against the present patent application.

SUMMARY

An embodiment that is described herein provides an Integrated Circuit (IC) including an electronic circuit and reliability monitoring circuitry. The electronic circuit includes multiple electronic components. The reliability monitoring circuitry is configured to assess, during operation of the IC in a host system, one or more parameters indicative of a reliability of one or more components-of-interest, selected from among the electronic components, and to provide an output indicative of the reliability.

In some embodiments, the IC further includes one or more duplicate components that are configured to mimic the one or more components-of-interest, and the reliability monitoring circuitry is coupled to the one or more duplicate components and is configured to assess the one or more parameters on the one or more duplicate components.

In an embodiment, a duplicate component is configured to mimic a respective component-of-interest by having a layout that mimics the layout of the respective component-of-interest. Additionally or alternatively, a duplicate component is configured to mimic a respective component-of-interest by undergoing a usage pattern that mimics the usage pattern of the respective component-of-interest. Further additionally or alternatively, a duplicate component is configured to mimic a respective component-of-interest by being located within a predefined proximity to the respective component-of-interest in the IC.

In some embodiments, the duplicate components include two or more duplicate components that mimic a same component-of-interest, and the reliability monitoring circuitry is configured to assess the one or more parameters for the same component-of-interest by combining corresponding parameters assessed on the two or more duplicate components.

In alternative embodiments, the reliability monitoring circuitry is configured to connect to the one or more components-of-interest and to assess the one or more parameters on the one or more components-of-interest. In an example embodiment, the IC further includes switches that are configured to selectably connect the reliability monitoring circuitry to the one or more components-of-interest, and the reliability monitoring circuitry is configured to intermittently connect to the one or more components-of-interest via the switches.

In some embodiments, at least one of the components-of-interest includes a Field-Effect Transistor (FET), and the reliability monitoring circuitry is configured to assess for the FET one or both of (i) a drain-side saturation current and (ii) a threshold voltage. Additionally or alternatively, at least one of the components-of-interest includes a resistor, and the reliability monitoring circuitry is configured to assess one of (i) a current flowing through the resistor and (ii) a voltage across the resistor. Further additionally or alternatively, at least one of the components-of-interest includes a capacitor, and the reliability monitoring circuitry is configured to assess a leakage current of the capacitor.

In an embodiment, the reliability monitoring circuitry is configured to issue an alert in response to the reliability violating a predefined condition.

There is additionally provided, in accordance with an embodiment that is described herein, a method for reliability monitoring in an Integrated Circuit (IC) comprising multiple electronic components. The method includes assessing, using reliability monitoring circuitry in the IC, during operation of the IC in a host system, one or more parameters indicative of a reliability of one or more components-of-interest, selected from among the electronic components. An output indicative of the reliability is provided.

The present disclosure will be more fully understood from the following detailed description of the embodiments thereof, taken together with the drawings in which:

DETAILED DESCRIPTION OF EMBODIMENTS

Embodiments that are described herein provide improved methods and circuitry for monitoring the reliability of Integrated Circuits (ICs). The disclosed techniques monitor the reliability of an IC in-situ, along the lifetime of the IC as it operates in a host system. The monitoring results can be used, possibly in real-time, for detecting or predicting reliability degradation in advance and taking appropriate measures before failure occurs.

In the disclosed embodiments, an IC comprises electronic circuitry comprising multiple electronic components. The IC further comprises reliability monitoring circuitry, which is configured to monitor parameters of one or more "components-of-interest." The components-of-interest typically are selected for reliability monitoring in advance, as part of the IC design. Components-of-interest may be, for example, components that operate at a high electrical or thermal stress, or that are otherwise expected to dominate the overall reliability of the IC.

The reliability monitoring circuitry monitors one or more parameters indicative of the reliability of the components-of-interest along the lifetime of the IC, and provides an output indicative of the reliability. In some example embodiments the output comprises a proactive alert, e.g., an indication that the IC is approaching end-of-life. In other embodiments the output comprises passive logging of numerical results in memory, for possible querying by a user.

In some embodiments, instead of monitoring the parameters of the actual components-of-interest, the reliability monitoring circuitry monitors duplicate components that mimic the components-of-interest. In the present context, the term "mimic" refers to any feature or operating condition that has an impact on reliability. For example, the duplicate components typically have similar layouts to the respective components-of-interest, undergo similar usage patterns with regard to electrical voltages and currents, and/or are located in close proximity to the respective components-of-interest. In these embodiments, the reliability monitoring circuitry assesses the parameters of the components of interest indirectly, by monitoring comparable parameters of the duplicate components. This technique obviates the need for any coupling or interruption to the electronic circuitry of the IC.

In other embodiments, the reliability monitoring circuitry is configured to intermittently connect to the components-of-interest, e.g., via suitable switches. This technique assesses the reliability of the components-of-interest by measuring the parameters of the actual components-of-interest. This, however, comes at the price of possible interruption to the normal operation of the IC. Interruption can be minimized, for example, by connecting to the components-of-interest infrequently and for short periods of time, and/or at known idle times.

Figure 1:
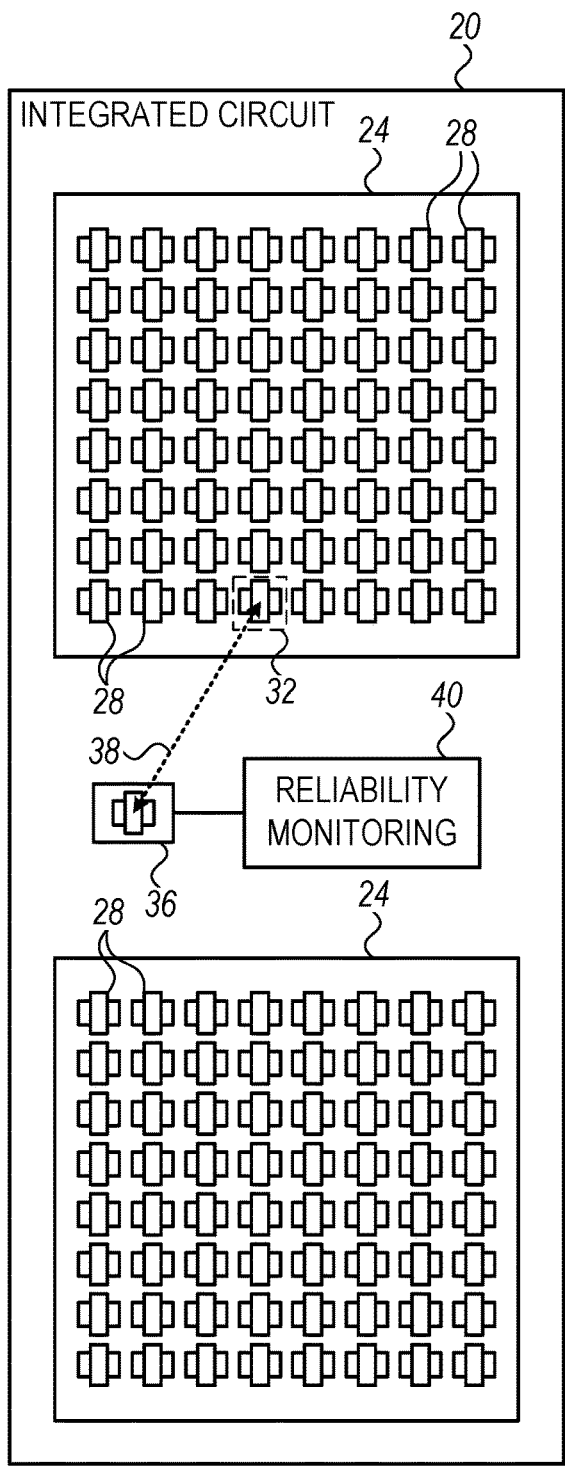
FIGS. 1-3 are block diagrams that schematically illustrate Integrated Circuits (ICs) employing in-situ reliability monitoring, in accordance with embodiments that are described herein.

FIG. 1 is a block diagram that schematically illustrates an Integrated Circuit (IC) 20 employing in-situ reliability monitoring, in accordance with an embodiment that is described herein. IC 20 comprises one or more electronic circuits 24 comprising multiple electronic components 28. In various embodiments electronic circuits 24 may have any suitable structure, may be manufactured in any suitable process technology, and may perform any suitable function.

Electronic components 28 may comprise, for example, transistors, diodes, resistors, capacitors, inductors, wires or other interconnections, and/or any other suitable components. FIG. 1 illustrates a plurality of transistors, purely by way of example. In real-life implementations, each electronic circuit 24 typically comprises a variety of different types of components 28.

In some embodiments, one or more of components 28 are selected and designated as "components-of-interest" 32. The figure shows a single component-of-interest 32, for the sake of clarity. In various embodiments, any suitable number of components-of-interest 32 may be selected.

In many of the examples discussed herein, components-of-interest 32 comprise Field-Effect Transistors (FETs). One typical example is a FinFET device implemented in a 5 nm process. Generally, however, the disclosed techniques are applicable to any suitable type of components-of-interest, and to any other suitable type of manufacturing process. In the present example each component-of-interest comprises a single device. Alternatively, a component-of-interest may comprise a plurality of interconnected devices, e.g., a subcircuit having a certain designated function.

Components-of-interest 32 typically are selected in advance, during the design of IC 20, for in-situ reliability monitoring. The selection of components-of-interest 32 typically aims to identify and monitor components whose reliability has a considerable impact on the overall reliability of IC 20. Such components may comprise, for example, components that operate at an exceptionally high electrical or thermal stress, i.e., at operating conditions that are exceptionally close to specified limits. In one example, an operating voltage that is within 50 mV or 5% of the maximal allowed voltage (whichever is larger) is considered "exceptionally high," and an operating voltage that is within 100 mV or 10% of the maximal allowed voltage (whichever is larger) is considered "very high." Alternatively, any other suitable criteria can be used.

Good candidates for components-of-interest 32 can be identified, for example, during the design phase of IC 20, by performing reliability analysis and/or stress/aging simulations on at least part of circuit 24. When analyzing transistors, for example, transistors that operate at high voltages and/or high duty-cycles across the transistor terminals are likely to have relatively short lifetimes that impact the IC reliability.

For a transistor, for example, an aging simulation can be useful in estimating the transistor lifetime based on factors such as gate oxide Time Dependent Dielectric Breakdown (TDDB), Hot Carrier Injection (HCI), Negative Bias Temperature Instability (NBTI, for PMOS devices) or Positive Bias Temperature Instability (PBTI, for NMOS devices). One major effect having an impact on reliability is shifting in the transistor threshold voltage (Vt) due to physical gate dielectric material wear-out induced by factors such as the factors listed above. Such a Vt shift causes the transistor driving current (e.g., the drain-side saturation current—Idsat) to drop. In a typical digital circuit block built around such a transistor, once Idsat drops by more than a predefined threshold, e.g., by more than 15% or 10%, the circuit block may fail to meet its specified timing conditions.

In practice, reliability analysis and/or stress/aging simulations are often inaccurate in predicting absolute reliabilities or absolute lifetimes. Such tools are, however, effective in determining relative reliabilities or lifetimes, among different components in a circuit. As such, reliability analysis and/or stress/aging simulations are useful for identifying and selecting components-of-interest 32. Additionally or alternatively, components-of-interest 32 may be selected in any other suitable manner and in accordance with any other suitable criteria.

In some embodiments, IC 20 further comprises one or more "duplicate components" 36. In the example of FIG. 1, each duplicate component 36 is implemented in a way that mimics a respective component-of-interest 32, as will be elaborated below. IC 20 further comprises a reliability monitoring circuitry 40 that monitors duplicate components 36. In these embodiments, reliability monitoring circuitry 40 monitors parameters of duplicate components 36 instead of monitoring the parameters of components-of-interest 32. Assuming the mimicking is accurate, such indirect monitoring is able to achieve high accuracy, without having to connect to electronic circuit 24 at all.

Typically, a duplicate component 36 mimics a corresponding component-of-interest 32 in one or more of the following aspects:

Physical layout: Each duplicate component 36 is fabricated with the same physical layout, e.g., layer structure on the IC substrate, physical dimensions of component features and interconnection terminals, as the corresponding component-of-interest 32. The similarity in layout ensures that manufacturing behavior (e.g., work function metal thickness, gate critical dimensions in the case of a transistor) of the component-of-interest 32 will be reflected in the corresponding duplicate component 36 with high accuracy.

Physical proximity: Each duplicate component 36 is located within a predefined proximity to the corresponding component-of-interest 32. This condition ensures that process variations across the IC die have little effect on the accuracy of mimicking. In the example of FIG. 1, a distance 38 between component-of-interest 32 and the corresponding duplicate component 36 is limited to a predefined maximal distance.

Usage pattern: Each duplicate component 36 undergoes a similar usage pattern to the corresponding component-of-interest 32. In the present context, the term "usage pattern" refers to the pattern of parameters such as voltages, currents, duty-cycles and temperatures, as a function of time. This condition ensures that the reliability of the duplicate component 36 deteriorates over time in a similar manner to the corresponding component-of-interest 32 (i.e., that the duplicate component 36 and the corresponding component-of-interest 32 age in a similar manner).

Additionally or alternatively, duplicate components 36 may mimic the respective components-of-interest 32 in any other suitable aspect having an impact on reliability.

In some embodiments, in order for a duplicate component 36 to undergo a similar usage pattern to the corresponding component-of-interest 32, it is necessary to duplicate additional components. Such additional components may be needed for example, to provide similar voltages and/or currents as experienced by the component-of-interest. In some cases only a small number of components will need to be duplicated. In more complex cases it may be necessary to duplicate an entire sub-circuit around the duplicate component.

In some embodiments, reliability monitoring circuitry 40 monitors one or more parameters of each duplicate component 36. For FETs, for example, reliability monitoring circuitry 40 typically monitors parameters such as threshold voltage (Vt) and drain-side saturation current (Idsat), since variations in these parameters are highly correlated to the reliability and aging of a FET. Additionally or alternatively, reliability monitoring circuitry 40 may monitor any other suitable parameters that are indicative of the reliability of duplicate components 36, and thus of the corresponding components-of-interest 32. A degradation in reliability can be identified, for example, by observing a shift in a parameter value (e.g., voltage, current or resistance) that is larger than a predefined shift, relative to the start-of-life value of this parameter.

As noted above, the disclosed techniques are not limited to FETs. In various embodiments, any suitable type of components may be selected to serve as components-of-interest 32. In some embodiments, a component-of-interest 32 comprises a high-accuracy resistor. In one such embodiment, the parameter monitored by reliability monitoring circuitry 40 is the current flowing through the resistor when a specified voltage is applied across the resistor. In an alternative embodiment, the parameter monitored by reliability monitoring circuitry is the voltage across the resistor in response to a specified current through the resistor. In both cases the monitored parameter is indicative of the actual resistance of the resistor. In other embodiments, a component-of-interest 32 comprises a capacitor, and the parameter monitored by reliability monitoring circuitry 40 is the leakage current of the capacitor, when a specified voltage is applied across the capacitor.

Typically, reliability monitoring circuitry 40 monitors the parameters of duplicate components 36 at suitable times along the operational lifetime of IC 20. Monitoring may be continuous or intermittent, e.g., at periodic intervals. Based on the monitored parameters, reliability monitoring circuitry 40 provides an output that is indicative of the reliability of components-of-interest 32, and therefore indicative of the reliability of IC 20 as a whole.

In some embodiments the output provided by reliability monitoring circuitry 40 comprises a proactive alert or other responsive action. For example, in one embodiment reliability monitoring circuitry 40 evaluates a predefined alert criterion, and issues an alert if the criterion is met. For a FET, for example, reliability monitoring circuitry 40 may evaluate the change in threshold voltage (Vt) or in drain-side saturation current (Idsat) relative to the start-of-life values of the same component. If the change in Vt or Idsat indicates that end-of-life of the FET is imminent, reliability monitoring circuitry 40 may issue an alert to a user.

In other embodiments the output provided by reliability monitoring circuitry 40 comprises passive logging of information. For a FET, for example, reliability monitoring circuitry 40 may log the Vt and/or Idsat values in a memory or register in IC 20. In this embodiment, a user may look-up the logged values and take suitable action if appropriate.

In the above examples, each duplicate component 36 corresponds to a single respective component-of-interest 32. One-to-one correspondence of this sort, however, is not mandatory, as will be elaborated with respect to FIG. 2 below.

Figure 2:
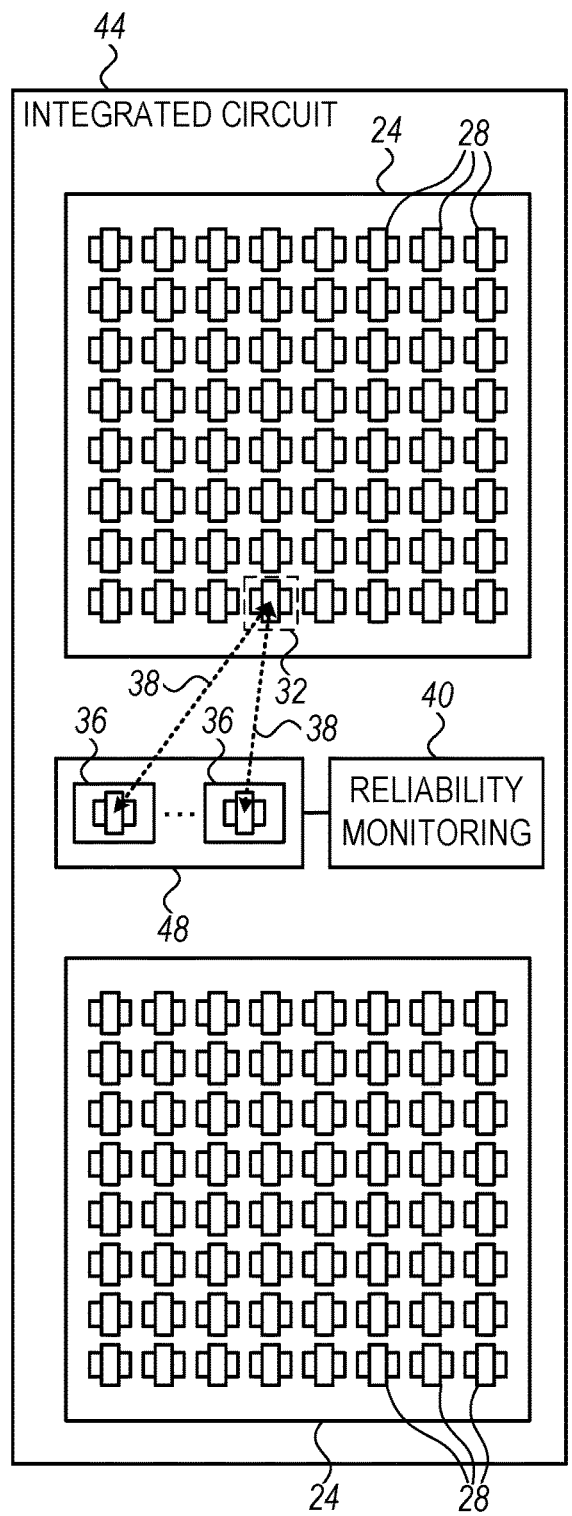

FIG. 2 is a block diagram that schematically illustrates an IC 44 employing in-situ reliability monitoring, in accordance with another embodiment that is described herein. In contrast to the example of FIG. 1 above, IC 44 of FIG. 2 comprises a set 48 of multiple duplicate components 36, all of which mimic the same component-of-interest 32. The aspects of mimicking are similar to those listed above. In other words, in an embodiment, all duplicate components 36 in set 48 have the same layout as the mimicked component-of-interest 32, are located within a predefined proximity (e.g., distances 38) to the mimicked component-of-interest 32, and/or undergo the same usage pattern as the mimicked component-of-interest 32.

In this embodiment, reliability monitoring circuitry 40 assesses the reliability of a component-of-interest 32 based on the monitored parameters of multiple duplicate components 36 that mimic this component-of-interest. In an example embodiment, reliability monitoring circuitry 40 combines (e.g., calculates an average over) corresponding parameters that have been assessed over the duplicate components 36 in set 48. Reliability monitoring circuitry 40 then estimates the reliability of the corresponding single component-of-interest 32 based on the combined parameters. Combining parameter measurements over multiple duplicate components helps to average-out component-to-component process variations. As such, a parameter that is combined over multiple duplicate components 36 is likely to be closer to the corresponding parameter of component-of-interest 32, than a parameter assessed over a single duplicate component 36.

When component-of-interest 32 and duplicate components 36 comprise FETs, reliability monitoring circuitry 40 may calculate, for example, the average threshold voltage over set 48, and/or the average drain-side saturation voltage over set 48. For other types of components, reliability monitoring circuitry 40 may calculate and combine other suitable parameters.

In various embodiments, reliability monitoring circuitry 40 may apply various kinds of combining to the parameters assessed over the multiple duplicate components 36 in set 48. Examples of combining comprise calculation of various kinds of averages, removal of statistically-deviant values ("outliers"), and the like.

Figure 3:
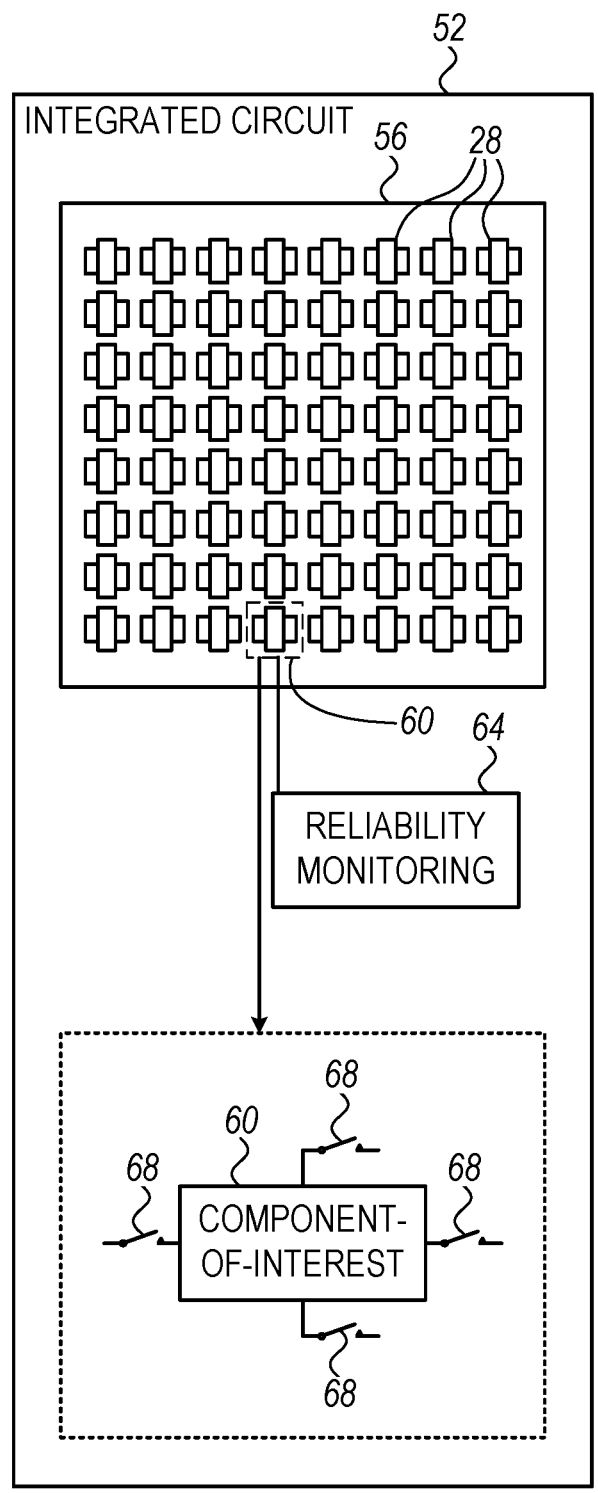

FIG. 3 is a block diagram that schematically illustrates an IC 52 employing in-situ reliability monitoring, in accordance with yet another embodiment that is described herein. In the example of FIG. 3, IC 52 comprises an electronic circuit 56 comprising multiple components 28, and reliability monitoring circuitry 64, similarly to circuit 24 of FIGS. 1 and 2. As in the examples of FIGS. 1 and 2, one or more of components 28 are selected to serve as components-of-interest 60. The parameters being assessed, and the types of output provided by the reliability monitoring circuitry, are also similar to the previous examples.

In contrast to the previous examples, however, in the present embodiment reliability monitoring circuitry 64 directly monitors the parameters of the actual components-of-interest 60. As seen in an inset at the bottom of FIG. 3, in an embodiment, the interconnection terminals of component-of-interest 60 are connected to switches 68. Switches 68 are controlled by reliability monitoring circuitry 64. In one setting, switches 68 connect reliability monitoring circuitry 64 to the terminals of component-of-interest 60, for measuring one or more parameters of component-of-interest 60. In the other setting, switches 68 disconnect reliability monitoring circuitry 64 from the terminals of component-of-interest 60, for normal operation with no disturbance from reliability monitoring circuitry 64.

In such embodiments, reliability monitoring circuitry 64 connects to components-of-interest 60 only intermittently, when measurements need to be taken. Typically, the terminals of component-of-interest 60 remain connected to neighboring devices in circuit 56 in both settings of switches 68.

In alternative embodiments, reliability monitoring circuitry 64 is always connected to the terminals of components-of-interest 60, and switches 68 are omitted. In such embodiments, care should be taken to prevent reliability monitoring circuitry 64 from disrupting the normal operation of circuit 56.

The configurations of ICs 20, 44 and 52, and their components such as circuits 24 and 56 and reliability monitoring circuitries 40 and 64, as shown in FIGS. 1-3, are example configurations that are depicted solely for the sake of clarity. In alternative embodiments, any other suitable configurations can be used. Elements that are not mandatory for understanding of the disclosed techniques have been omitted from the figure for the sake of clarity.

ICs 20, 44 and 52 may be implemented using dedicated hardware or firmware, such as using programmable logic, e.g., in an Application-Specific Integrated Circuit (ASIC) or Field-Programmable Gate Array (FPGA). Additionally or alternatively, some functions, e.g., functions of reliability monitoring circuitries 40 or 64, may be implemented in software and/or using a combination of hardware and software elements.

In some embodiments, reliability monitoring circuitry 40 and/or reliability monitoring circuitry 64 comprises a general-purpose computer, which is programmed in software to carry out the functions described herein. The software may be downloaded to the computer in electronic form, over a network, for example, or it may, alternatively or additionally, be provided and/or stored on non-transitory tangible media, such as magnetic, optical, or electronic memory.

Figure 4:
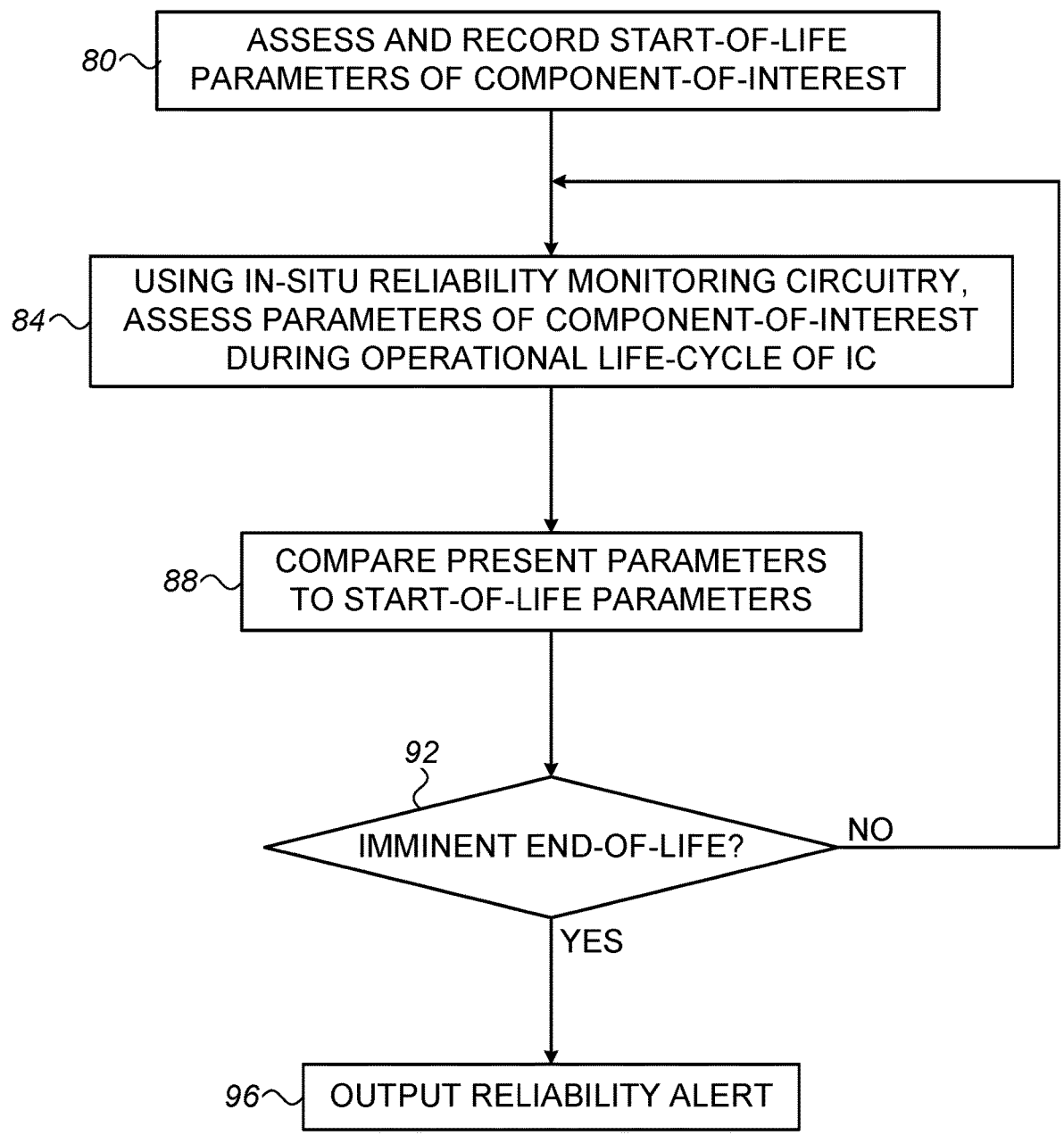
FIG. 4 is a flow chart that schematically illustrates a method for in-situ reliability monitoring, in accordance with an embodiment that is described herein.

FIG. 4 is a flow chart that schematically illustrates a method for in-situ reliability monitoring, in accordance with an embodiment that is described herein. The method of FIG. 4 may be carried out by reliability monitoring circuitry 40 (FIGS. 1 and 2) or by reliability monitoring circuitry 64 (FIG. 3). For clarity, the method description refers to a single component-of-interest, e.g., component 32 (FIGS. 1 and 2) or component 60 (FIG. 3).

The method begins at an initialization operation 80, with the reliability monitoring circuitry assessing and recording the start-of-life values of one or more parameters of the component-of-interest. At a measurement operation 84, the reliability monitoring circuitry assesses the parameters of the component-of-interest during the operational lifetime of the IC.

At a comparison operation 88, the reliability monitoring circuitry compares the present parameter values (assessed at operation 84) to the start-of-life values (assessed at operation 80). At a checking operation 92, the reliability monitoring circuitry checks whether the comparison indicates that end-of-life of the IC is imminent. As noted above with regard to FETs, the reliability monitoring circuitry may declare imminent end-of-life when the transistor threshold voltage (Vt) shifts by more than 10% or 15%, or when the transistor drain-side saturation current (Idsat) drops by more than 10% or 15%.

If the comparison at operation 88 indicates that end-of-life is imminent, the reliability monitoring circuitry outputs a reliability alert, at an alerting operation 96. Otherwise, the method loops back to operation 84 above.

The method flow of FIG. 4 is an example flow. In alternative embodiments, any other suitable flow can be used. For example, in some embodiments the comparison at operation 88 is a one-to-one comparison of the present value and the start-of-life value of a certain parameter, and the decision at operation 92 depends on the difference between the present value and the start-of-life value. In other embodiments, the reliability monitoring circuitry may carry out more complex form or comparison, analysis and/or decision. For example, the reliability monitoring circuitry may jointly consider the values of two or more parameters in deciding whether end-of-life is imminent. Additionally or alternatively, the reliability monitoring circuitry may consider the parameter values at more than two points in time. The latter technique enables the reliability monitoring circuitry to establish, for example, whether the degradation in the parameter value over time is linear or other.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:
   an electronic circuit comprising multiple electronic components;

reliability monitoring circuitry, which is configured to assess, during operation of the IC in a host system, one or more parameters indicative of a reliability of one or more components-of-interest, selected from among the electronic components of the electronic circuit, by connecting to the one or more components-of-interest, the one or more components-of-interest constituting actual operative electronic components of the electronic circuit that are configured to perform functions within the electronic circuit, and assessing the one or more parameters indicative of reliability on the one or more components-of-interest, and to provide an output indicative of the reliability; and switches having (i) a first setting in which the switches connect selected ones of the one or more components-of-interest to the reliability monitoring circuitry to be monitored for reliability, and (ii) a second setting in which the switches disconnect the selected one or more components-of-interest from the reliability monitoring circuitry, wherein the reliability monitoring circuitry is configured to control the switches at selected times to select between the first setting and the second setting.

2. IC according to claim 1, wherein the switches are configured to selectably connect the reliability monitoring circuitry to the selected one or more components-of-interest, and wherein the reliability monitoring circuitry is configured to intermittently connect to the selected one or more components-of-interest via the switches.

3. The IC according to claim 1, wherein at least one of the components-of-interest comprises a Field-Effect Transistor (FET), and wherein the reliability monitoring circuitry is configured to assess for the FET one or both of (i) a drain-side saturation current and (ii) a threshold voltage.

4. The IC according to claim 1, wherein at least one of the components-of-interest comprises a resistor, and wherein the reliability monitoring circuitry is configured to assess one of (i) a current flowing through the resistor and (ii) a voltage across the resistor.

5. The IC according to claim 1, wherein at least one of the components-of-interest comprises a capacitor, and wherein the reliability monitoring circuitry is configured to assess a leakage current of the capacitor.

6. The IC according to claim 1, wherein the reliability monitoring circuitry is configured to issue an alert in response to the reliability violating a predefined condition.

7. The IC according to claim 1, wherein the switches in the first setting connect the selected ones of the one or more components-of-interest to the reliability monitoring circuitry during idle times in operation of the electronic circuit.

8. A method for reliability monitoring in an Integrated Circuit (IC) comprising multiple electronic components, the method comprising:

using reliability monitoring circuitry in the IC, assessing, during operation of the IC in a host system, one or more parameters indicative of a reliability of one or more components-of-interest, selected from among the electronic components of the electronic circuit, by connecting the reliability monitoring circuitry to the one or more components-of-interest, the components-of-interest constituting the actual operative electronic components of the electronic circuit that are configured to perform functions within the electronic circuit, the connecting via switches having (i) a first setting in which the switches connect selected ones of the one or more components-of-interest to the reliability monitoring circuitry to be monitored for reliability, and (ii) a second setting in which the switches disconnect the selected one or more components-of-interest from the reliability monitoring circuitry;

the reliability monitoring circuitry configured to control the switches to select between the first setting and the second setting, and the reliability monitoring circuitry selecting the first setting to assess the one or more parameters indicative of reliability of selected ones of the one or more components-of-interest; and providing an output indicative of the reliability of the selected one or more components-of-interest based on the assessed parameters.

9. The method according to claim 8, wherein the switches in the first setting connect the selected ones of the one or more components-of-interest to the reliability monitoring circuitry during idle times during operation of the electronic circuit.

10. An Integrated Circuit (IC), comprising:

an electronic circuit comprising multiple electronic components;

two or more duplicate components that are configured to mimic a same component-of-interest selected from among the electronic components of the electronic circuit; and reliability monitoring circuitry, which is coupled to the two or more duplicate components and is configured to assess on the two or more duplicate components, during operation of the IC in a host system, one or more parameters indicative of a reliability of the same component-of-interest, by combining corresponding parameters assessed on the two or more duplicate components.

11. The IC according to claim 10, wherein the reliability monitoring circuitry is configured to assess the one or more parameters on the two or more duplicate components, which have been subject to a same usage pattern as the same component-of-interest.

12. A method for reliability monitoring in an Integrated Circuit (IC) comprising multiple electronic components, the method comprising:

using reliability monitoring circuitry in the IC, assessing, during operation of the IC in a host system, one or more parameters indicative of a reliability of a same component-of-interest, selected from among the electronic components, by assessing the one or more parameters on two or more duplicate components in the IC, which are configured to mimic the same component-of-interest and combining corresponding parameters assessed on the two or more duplicate components; and providing an output indicative of the reliability.

13. The method according to claim 12, wherein the assessing the one or more parameters on two or more duplicate components in the IC, is based on the two or more duplicate components having been subjected to a same usage pattern as the same component-of-interest.

\* \* \* \* \*